US012701996B2

(12) United States Patent　　　　　　(10) Patent No.:　US 12,701,996 B2
Jo et al.　　　　　　　　　　　　　　　(45) Date of Patent:　　　Aug. 4, 2026

(54) FILM PACKAGE

(71) Applicant: Samsung Electronics Co., Ltd., Suwon-si (KR)

(72) Inventors: Sungeun Jo, Hwaseong-si (KR); Jaemin Jung, Seoul (KR); Jaechoon Kim, Incheon (KR); Seunggeol Ryu, Seoul (KR); Kyungsuk Oh, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 772 days.

(21) Appl. No.: 17/892,252

(22) Filed: Aug. 22, 2022

(65) Prior Publication Data

US 2023/0178450 A1　　Jun. 8, 2023

(30) Foreign Application Priority Data

Dec. 2, 2021　(KR) ........................ 10-2021-0170883

(51) Int. Cl.
　　*H10W 40/22*　　(2026.01)
　　*H10W 20/41*　　(2026.01)
(52) U.S. Cl.
　　CPC ......... *H10W 40/22* (2026.01); *H10W 20/435* (2026.01)
(58) Field of Classification Search
　　None
　　See application file for complete search history.

(56) References Cited

U.S. PATENT DOCUMENTS 6,456,353 B1　9/2002　Chen
8,508,056 B2　8/2013　Kim et al.

9,070,680 B2　6/2015　Kim
10,643,948 B2　5/2020　Jung et al.
2001/0050431 A1*　12/2001　Naitoh ................ H01L 23/5387
　　　　　　　　　　　　　　　　　　　257/E23.177
2009/0273076 A1　11/2009　Choi et al.
2018/0049324 A1　2/2018　Koo et al.
2018/0261524 A1*　9/2018　Huang .................. B32B 27/281
2018/0342437 A1　11/2018　Huang et al.
2019/0363051 A1*　11/2019　Jung .................. H01L 25/0655

FOREIGN PATENT DOCUMENTS

JP　　2002-124607　A　　4/2002
KR　　10-0658442　B1　　12/2006
KR　　10-2018-0018167　A　　2/2018
KR　　10-2019-0046435　A　　5/2019

OTHER PUBLICATIONS

Office Action in Korean Appln. No. 10-2021-0170883, mailed on Aug. 20, 2025, 9 pages (with English translation).

* cited by examiner

*Primary Examiner* — Dale E Page
*Assistant Examiner* — Patrick Cullen
(74) *Attorney, Agent, or Firm* — Fish & Richardson P.C.

(57)　　　　ABSTRACT

A film package, includes: a film substrate having first and second surfaces opposing each other; a plurality of wiring patterns respectively including an input pattern, an output pattern, and an interconnection pattern; a first semiconductor chip electrically connected to the input pattern and the interconnection pattern; a second semiconductor chip electrically connected to the interconnection pattern and the output pattern; a protective layer on the first surface to cover at least a portion of the plurality of wiring patterns; a first conductive film on the protective layer and extending in a second direction; and a second conductive film on the second surface to overlap the first conductive film in a third direction.

14 Claims, 11 Drawing Sheets

FILM PACKAGE

CROSS-REFERENCE TO RELATED APPLICATION

This application claims the priority and benefit of Korean Patent Application No. 10-2021-0170883, filed on Dec. 2, 2021, with the Korean Intellectual Property Office, the disclosure of which is incorporated herein in its entirety by reference.

BACKGROUND

1. Field

The present inventive concepts relate to a film package.

2. Description of Related Art

In order to cope with the recent trend of miniaturization, thinness, and weight reduction of electronic products, chip on film (COF) package technologies using a flexible film substrate have been proposed. In the COF package, a semiconductor chip may be mounted on a film substrate in a flip-chip bonding method, and may be connected to an external device by an interconnection line. Such a COF package may be applied to a panel of a portable terminal device (such as a cellular phone and/or a PDA), a laptop computer, and/or a display device.

SUMMARY

An aspect of the present inventive concepts is to provide a film package having improved heat dissipation properties.

An aspect of the present inventive concepts is to provide a film package having reduced manufacturing costs and improved yield.

According to an aspect of the present inventive concepts, a film package is provided. The film package includes: a film substrate having first and second surfaces opposing each other and first and second sides opposing each other, the first surface having a first region and a second region spaced apart in a first direction parallel to the first surface; a plurality of wiring patterns including an input pattern, an interconnection pattern, and an output pattern, the input pattern extending from the first region to the first side of the film substrate, the output pattern extending from the second region to the second side of the film substrate, and the interconnection pattern extending from the first region to the second region; a first semiconductor chip on the first region, and electrically connected to the input pattern and the interconnection pattern; at least one second semiconductor chip on the second region and electrically connected to the interconnection pattern and the output pattern; a protective layer on the first surface covering at least a portion of the plurality of wiring patterns, the protective layer including a first opening exposing at least a portion of the first region, a second opening exposing at least a portion of the second region, and a third opening exposing at least a portion of the input pattern adjacent to the first side; a first conductive film on the protective layer between the first opening and the third opening, and extending in a second direction, the second direction intersecting the first direction; and a second conductive film on the second surface and overlapping the first conductive film in a third direction, the third direction perpendicular to the first surface.

According to an aspect of the present inventive concepts, a film package is provided. The film package, includes: a film substrate having a first side and a second side opposing each other in a first direction; a first semiconductor chip on a first surface of the film substrate; at least one second semiconductor chip on the first surface of the film substrate, and spaced apart from the first semiconductor chip in the first direction; a first conductive film on the film substrate between the first semiconductor chip and the first side; and a second conductive film on a second surface of the film substrate such that the second conductive film is more closely adjacent to the first side than the second side in the first direction and overlaps at least a portion of the first conductive film in a second direction, the second perpendicular to the second surface.

According to an aspect of the present inventive concepts, a film package is provided. The film package, includes: a film substrate having a first side and a second side opposing each other; a first semiconductor chip on a first surface the film substrate such that the first semiconductor chip is adjacent to the first side; at least one second semiconductor chip on the first surface of the film substrate such that the second semiconductor chip is adjacent to the second side a first conductive film between the first semiconductor chip and the first side; and a second conductive film on a second surface of the film substrate, the second conductive film having a first portion between the first semiconductor chip and the first side on a plane and overlapping the first conductive film, and a second portion between the second semiconductor chip and the second side on the plane such that the second portion has a planar area smaller than the first portion.

BRIEF DESCRIPTION OF DRAWINGS

The above and other aspects, features, and advantages of the present inventive concepts will be more clearly understood from the following detailed description taken in conjunction with the accompanying drawings, in which.

DETAILED DESCRIPTION

Figure 1A:
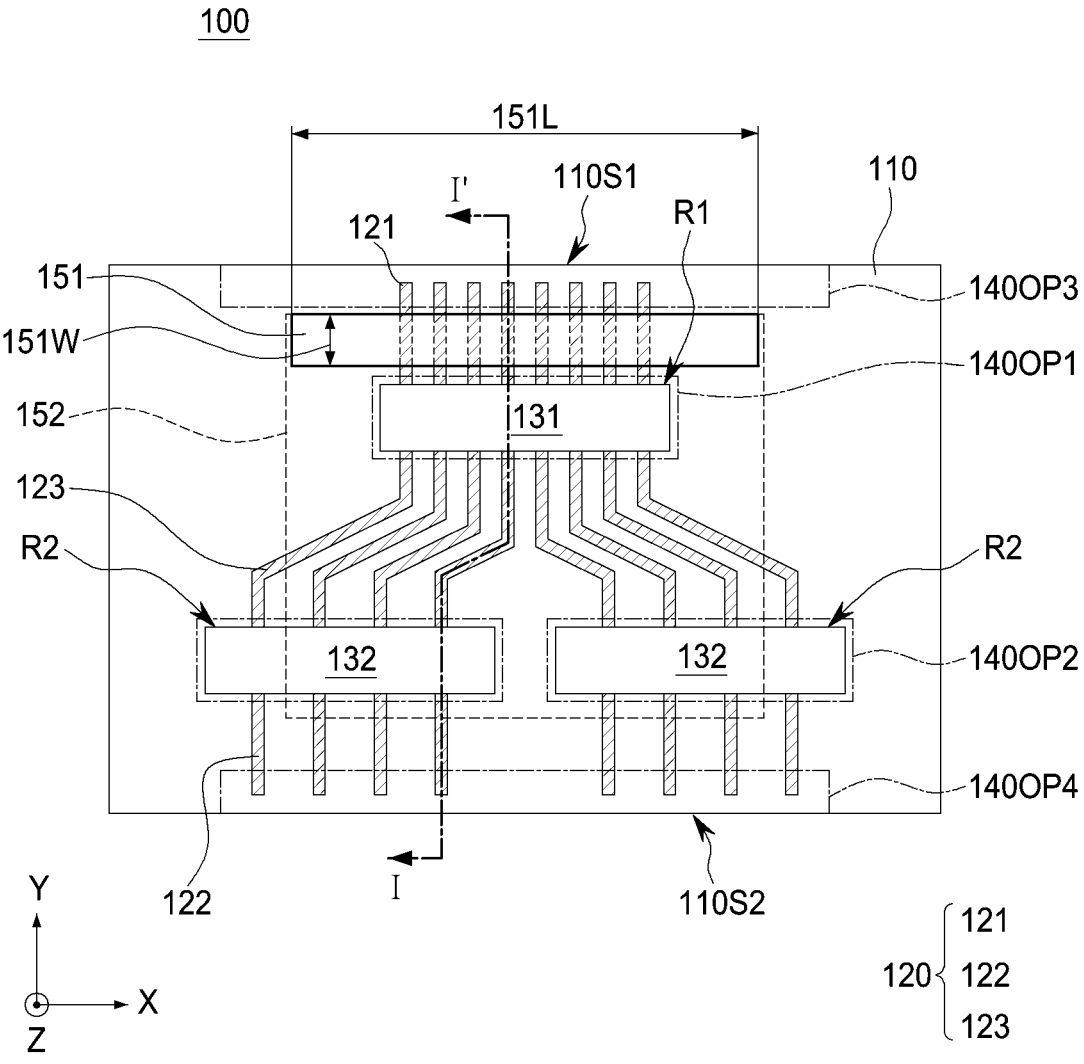
FIG. 1A is a plan view illustrating a film package according to an example embodiment of the present inventive concepts.

Hereinafter, some example embodiments of the present inventive concepts will be described with reference to the accompanying drawings, wherein like reference numerals refer to like elements throughout. In this regard, the present embodiments may have different forms and should not be construed as being limited to the descriptions set forth herein. Throughout the drawings, the size or thickness of each constituent element illustrated in the drawings may be exaggerated for convenience of explanation and clarity.

Figure 1B:
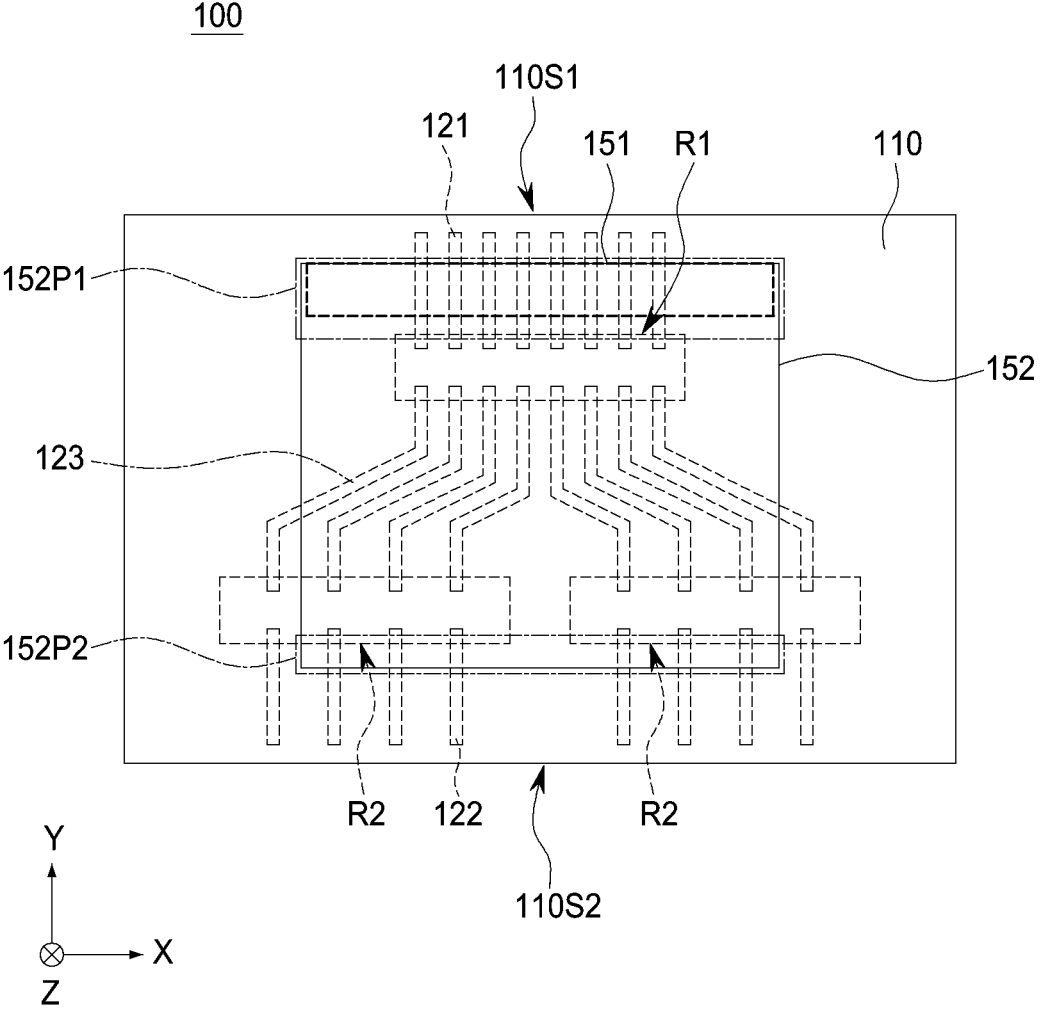
FIG. 1B is a bottom view of the film package of FIG. 1A.
Figure 1C:
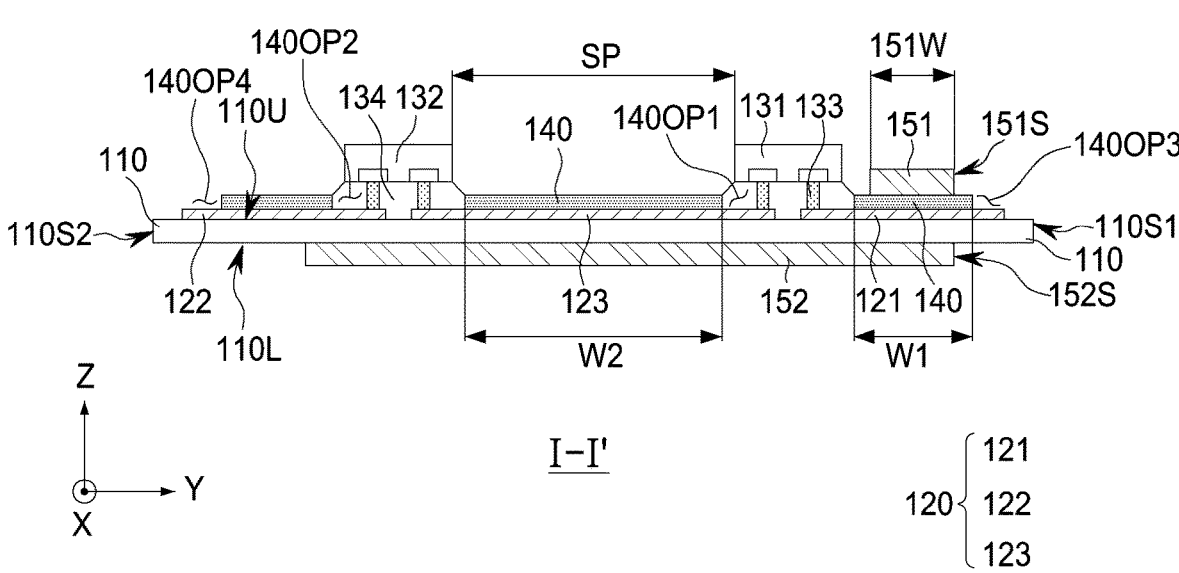
FIG. 1C is a cross-sectional view illustrating a cross-section taken along line I-I' in FIG. 1A.

FIG. 1A is a plan view illustrating a film package 100 according to an example embodiment of the present inventive concepts, FIG. 1B is a bottom view of the film package 100 of FIG. 1A, and FIG. 1C is a cross-sectional view illustrating a cross-section taken along line I-I' in FIG. 1A.

Referring to FIGS. 1A to 1C, the film package 100 may include a film substrate 110, a plurality of wiring patterns 120, a first semiconductor chip 131, at least one second semiconductor chip 132, a first conductive film 151, and a second conductive film 152. According to an example embodiment, the film package 100 may further include a protective layer 140. By disposing the first conductive film 151 and the second conductive film 152 adjacently to the first semiconductor chip 131 having relatively high power consumption, while minimizing an area of at least one of the first and second conductive films 151 and 152, it is possible to reduce manufacturing cost and effectively improve the heat dissipation characteristics of the film package 100. In addition, since the first conductive film 151 disposed on a mounting surface of the semiconductor chips does not cover the first and second semiconductor chips 131 and 132, process difficulty may be reduced and yield may be improved.

The film substrate 110 has a first surface 110U and a second surface 110L opposing each other in an opposite direction (e.g., the Z-axis direction), and has a first side 110S1 and a second side 110S2 opposing in a horizontal direction (e.g., the Y-axis direction), and the first surface 110U may include a first region R1 and a second region R2 spaced apart from the horizontal direction (or 'first direction') (e.g., the Y-axis direction). The first surface 110U may be a chip mounting surface on which the first and second semiconductor chips 131 and 132 are mounted, and the second surface 110L may be a surface opposite thereto. The first side 110S1 and the second side 110S2 may be side surfaces of the film substrate 110 spaced from a direction in which the first and second semiconductor chips 131 and 132 are spaced apart (and/or in a direction in which the plurality of wiring patterns 120 extend). Each of the first region R1 and the second region R2 may be a region in which the first and second semiconductor chips 131 and 132 are mounted. According to an example embodiment, each of the first region R1 and the second region R2 may be provided as a plurality of regions corresponding to the number of the first and second semiconductor chips 131 and 132.

The film substrate 110 may be a flexible film including polyimide, which is a material having excellent coefficient of thermal expansion and durability. However, the material of the film substrate 110 is not limited thereto, and may be formed of an epoxy-based resin, acrylic, a synthetic resin such as polyether nitrile, polyether sulfone, polyethylene terephthalate, polyethylene naphthalate, and/or the like.

The plurality of wiring patterns 120 may include an input pattern 121 extending from the first region R1 to the first side 110S1 of the film substrate 110, and an output pattern 122 extending from the second region R2 to the second side 110S2 of the film substrate 110, opposing the first side 110S1. The plurality of wiring patterns 120 may be formed of an electrically conductive material, for example, aluminum foil, copper foil, and/or the like. For example, the plurality of wiring patterns 120 may be formed by patterning a metal film formed on the film substrate 110 by a process such as casting, laminating, and/or electroplating. According to an example embodiment, at least a portion of the plurality of wiring patterns 120 may be formed on the second surface 110L of the film substrate 110, and the plurality of wiring patterns 120 may further include an interconnection via penetrating through the film substrate 110, and connecting those to the wiring patterns 120 on the first surface 110U.

The input pattern 121 may have one end adjacent to the first side 110S1 of the film substrate 110, and the other end extending to an edge of the first region R1, so that the input pattern 121 may connect the first semiconductor chip 131 to an external device (e.g., a printed circuit board). The output pattern 122 may have one end adjacent to the second side 110S2 of the film substrate 110, and the other end extending to an edge of the second region R2, so that the output pattern 122 may connect the second semiconductor chip 132 to an external device (e.g., a display panel). The interconnection pattern 123 may have one end extending to an edge of the first region R1 and the other end extending to an edge of the second region R2, so that the interconnection pattern 123 may electrically connect the first semiconductor chip 131 and the second semiconductor chip 132. According to an example embodiment, an interconnection pattern 123 extending from the first side 110S1 of the film substrate 110 to the second region R2 to directly connect the second semiconductor chip 132 to an external device (e.g., a printed circuit board) may be formed.

The first semiconductor chip 131 and the second semiconductor chip 132 may be mounted on the first surface 110U of the film substrate 110, and may be spaced apart from each other, for example, in a first direction (e.g., the Y-axis direction). The first semiconductor chip 131 may be mounted on the first region R1, and may be electrically connected to the input pattern 121 and the interconnection pattern 123. The second semiconductor chip 132 may be mounted on the second region R2, and connected to the interconnection pattern 123 and the output pattern 122, The first semiconductor chip 131 and the second semiconductor chip 132 may be mounted on the film substrate 110 by a flip-chip bonding method. For example, the first semiconductor chip 131 and the second semiconductor chip 132 may be physically and electrically connected to the plurality of wiring patterns 120 through connection bumps 133 (e.g., solder pillars and/or balls). An underfill film 134 sealing the connection bumps 133 may be formed between the first semiconductor chip 131 and the second semiconductor chip 132 and the film substrate 110. The underfill film 134 may be formed using, for example, an insulating resin such as an epoxy resin.

The first semiconductor chip 131 and the second semiconductor chip 132 may be a display driving chip (DDI) used to drive a display. For example, the first semiconductor chip 131 may be at least one source driving chip generating an image signal using a data signal transmitted from a timing controller, and outputting an image signal to a display panel (refer to '500' in FIG. 6A). The at least one second semiconductor chip 132 may be at least one gate driving chip outputting a scan signal including an on/off signal of a transistor to a display panel (refer to '500' in FIG. 6A), Meanwhile, the number of the first semiconductor chip 131 and the second semiconductor chip 132 is not limited to that illustrated in the drawings, and the first semiconductor chip 131 and the second semiconductor chip 132 may be provided in a larger or smaller amount than that illustrated in the drawings. However, due to the characteristics of the package module (refer to '1000' in FIG. 6A), the number of the second semiconductor chips 132 (e.g., gate driving chips) may be equal to or greater than the number of the first semiconductor chips 131 (e.g., source driving chips).

The protective layer 140 may be disposed on the first surface 110U to cover at least a portion of a plurality of wiring patterns 120 in order to protect the plurality of wiring patterns 120 from external physical and/or chemical damage. The protective layer 140 may include a first opening 140OP1 exposing at least a portion of the first region R1, a second opening 140OP2 exposing at least a portion of the second region R2, a third opening 140OP3 exposing at least a portion of an input pattern 121, adjacent to the first side 110S1, and a fourth opening 140OP4 exposing at least a portion of an output pattern 122, adjacent to the second side 110S2. The protective layer 140 covers the plurality of wiring patterns 120 as illustrated in FIG. 1C, but in FIGS. 1A and 1B, the protective layer 140 is omitted and only the first to fourth openings 140OP1 and 140OP2, 140OP3, and 140OP4 are shown with imaginary lines. The protective layer 140 may be formed of an insulating material, for example, solder resist and/or dry film resist.

The first conductive film 151 and the second conductive film 152 may have relatively high thermal conductivity. For example, the first conductive film 151 and the second conductive film 152 may have thermal conductivity of 200 W/mK or more. The first conductive film 151 and the second conductive film 152 may include metal such as aluminum, copper, and/or the like; and/or may include a carbon-containing material such as graphene, carbon nanotubes, graphite, and/or the like. An upper surface and a lower surface of each of the first conductive film 151 and the second conductive film 152 may be covered with an insulating adhesive film (not shown) including an epoxy-based polymer, an acrylic polymer, a silicone-containing material, and/or the like. According to some example embodiments, a protective film (not shown) may be formed on one surface of the insulating adhesive film (not shown) facing an opposite side of the film substrate 110 A protective film (not shown) may prevent damage (e.g., oxidation or corrosion) of the first conductive film 151 and the second conductive film 152 from, e.g., external impurities. The protective film (not shown) may include, for example, at least one of insulating polymers such as polyimide, polyethylene terephthalate (PET), polyethylene naphthalate (PEN), and/or the like. According to the present inventive concepts, heat dissipation characteristics of the film package 100 can be efficiently improved by disposing the first and second semiconductor chips 131 and 132 adjacently to the first semiconductor chip 131 having relatively high power consumption.

The first conductive film 151 may be disposed on the film substrate 110 (and/or the protective layer 140) between the first semiconductor chip 131 and the first side 110S1. The first conductive film 151 may be disposed on the protective layer 140 between the first opening 140OP1 and the third opening 140OP3 to have a predetermined (and/or otherwise determined) width 151W in a first direction (Y-axis direction). For example, the first conductive film 151 may have a width 151W equal to or smaller than the width W1 between the first opening 140OP1 and the third opening 140OP3. The width 151W of the first conductive film 151 may be, for example, in a range of about 1 mm to about 10 mm, and may be smaller than a separation distance SP between the first and second semiconductor chips 131 and 132. For example, a width W1 between the first opening 140OP1 and the third opening 140OP3 may be smaller than a width W2 between the first opening 140OP1 and the second opening 140OP2. In an example embodiment, the first conductive film 151 may have a bar shape extending in a longitudinal direction (or a second direction) (e.g., an X-axis direction) of the first semiconductor chip 131. For example, the first conductive film 151 may extend between the first opening 140OP1 and the third opening 140OP3 to have a predetermined (and/or otherwise determined) length 151L in the second direction (e.g., the X-axis direction) intersecting the first direction (e.g., the Y-axis direction) on a plane (X-Y plane). For example, in an example embodiment, the first conductive film 151 may have a rectangular shape having a width 151W of about 2 mm and a length 151L of about 35 mm on a plane (X-Y plane).

As described above, the first conductive film 151 may have a planar shape covering a region between the first side 110S1 of the film substrate 110 and the first semiconductor chip 131, and exposing the protective layer 140 between the first opening 140OP1 and the second openings 140OP2. For example, the first conductive film 151 is disposed on one side of the first semiconductor chip 131, which consumes relatively high power, but is spaced apart from the first semiconductor chip 131, so that defects such as voids, interfacial delamination, and/or the like (which may occur when the first conductive film 151 covers an upper surface or a side surface of the first semiconductor chip 131) may be prevented and/or suppressed, and process difficulty may be reduced. In addition, the first conductive film 151 may have a planar area equal to or greater than that of the first semiconductor chip 131 in order to maximize heat dissipation characteristics within a limited area between the first side 110S1 and the first semiconductor chip 131.

The second conductive film 152 may be disposed on the second surface 110L to overlap the first conductive film 151 in a vertical direction (or third direction) (e.g., the Z-axis direction), perpendicular to the first surface 110U. The second conductive film 152 may extend more adjacently to the first side 110S1 than the second side 110S2 in the first direction (e.g., Y-axis direction) to overlap at least a portion of the first conductive film 151 in the vertical direction (e.g., the Z-axis direction). In addition, the second conductive film 152 may have a planar area greater than that of the first conductive film 151 on a plane (X-Y plane) to overlap at least a portion of each of the first semiconductor chip 131 and the second semiconductor chip 132 in the third direction (e.g., Z-axis direction).

For example, the second conductive film 152 overlapping the first and second semiconductor chips 131 and 132 is disposed to be biased on one side of the first semiconductor chip 131, so that a heat flow from the second semiconductor chip 132 toward the first side 110S1 of the film substrate 110 may be formed, and the first and second conductive films 151 and 152 may overlap on the one side of the first semiconductor chip 131 (density of a heat conductive material increases), so that a heat flow from the first semiconductor chip 131 toward the first side 110S1 of the film substrate 110 may be further increased. From a viewpoint of increasing the heat flow to the first side 110S1 of the film substrate 110, as illustrated in FIG. 1B, the second conductive film 152 is disposed below the film substrate 110, may have a first portion 152P1 positioned between the first semiconductor chip 131 and the first side 110S1 on a plane and overlapping the first conductive film 151, and a second portion 152P2 positioned between the second semiconductor chip 132 and the second side 110S2, and the first portion 152P1 may have a planar area greater than a planar area of the second portion 152P2.

The first conductive film 151 may be formed not to cover the third opening 140OP3 or the input pattern 121 exposed through the third opening 140OP3. For example, the first conductive film 151 may have a first edge 151S spaced apart from the first side 110S1 by a first distance. Similarly, the second conductive film 152 may be formed not to vertically overlap with the third opening 140OP3 or the input pattern 121 exposed through the third opening 140OP3. For example, the second conductive film 152 may have a second edge 152S spaced apart from the first distance by a second distance substantially equal to the first distance. For example, the first edge 151S and the second edge 152S may be substantially on the same line in the third direction (Z-axis direction). However, the example embodiments are not limited thereto, and according to an example embodiment, the second conductive film 152 may extend to a region overlapping the opening 140OP3 (example embodiments of FIGS. 2A and 2B).

Figure 2A:
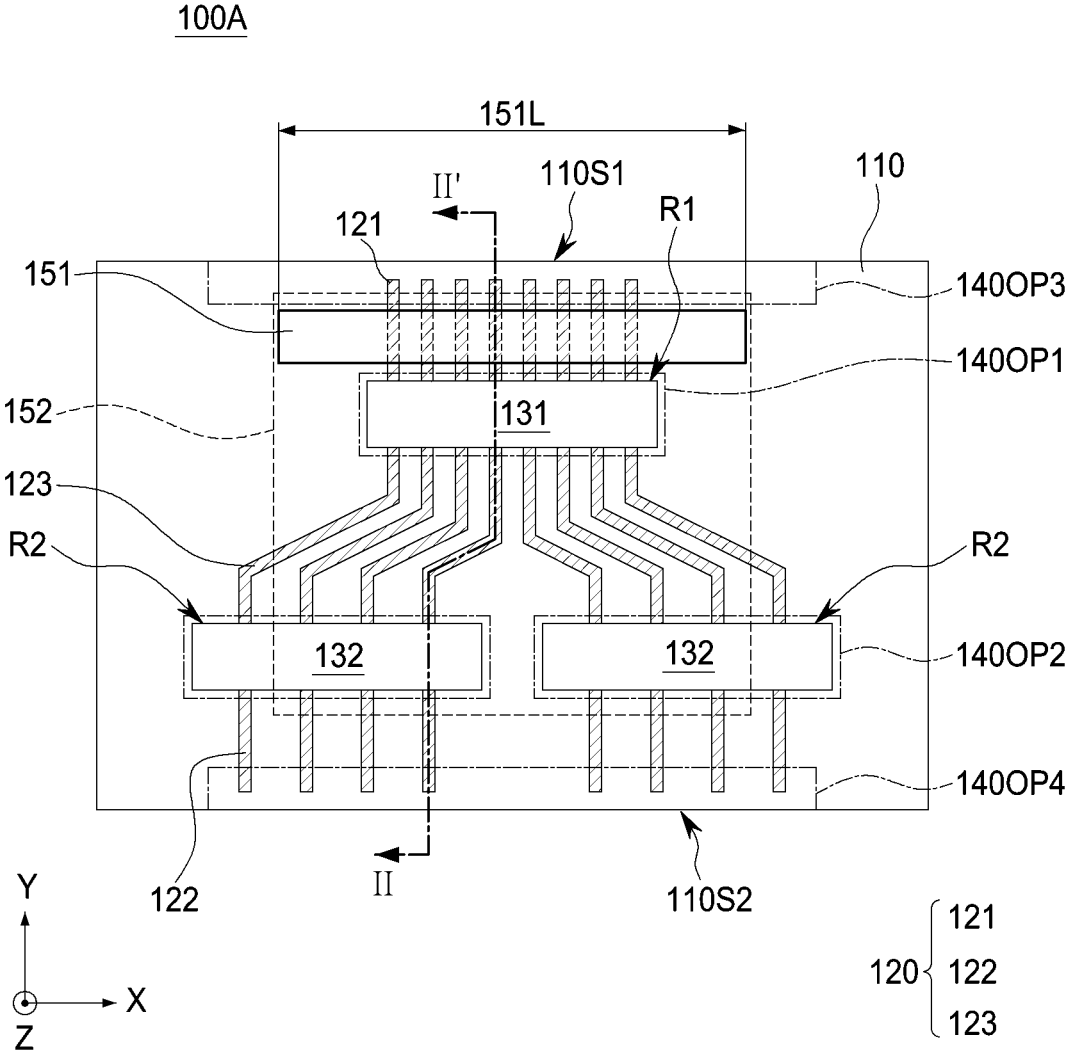
FIG. 2A is a plan view illustrating a film package according to an example embodiment of the present inventive concepts.
Figure 2B:
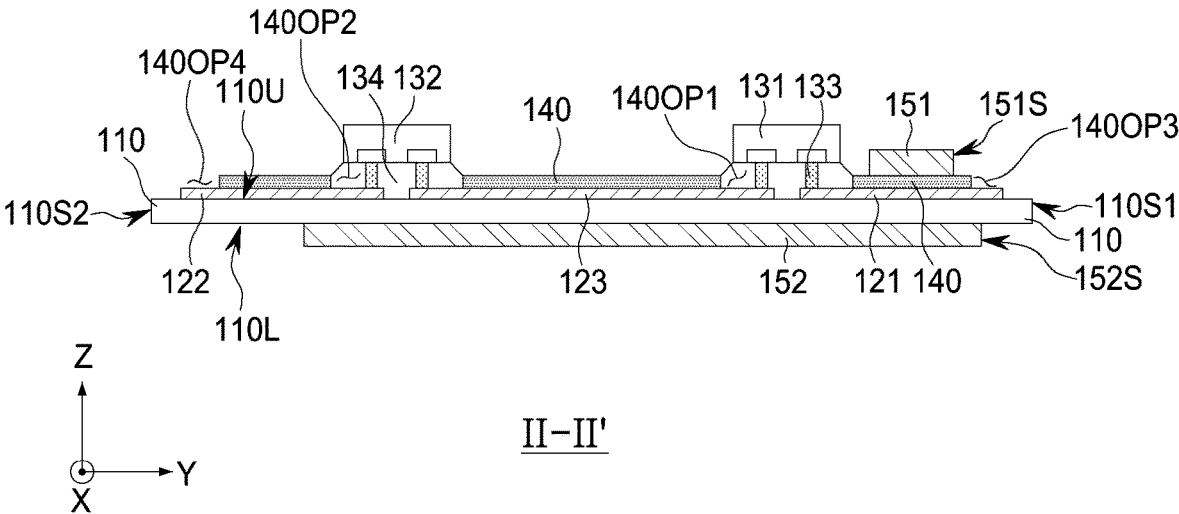
FIG. 2B is a cross-sectional view illustrating a cross-section taken along line II-II' of FIG. 2A.

FIG. 2A is a plan view illustrating a film package 100A according to an example embodiment of the present inventive concept, and FIG. 2B is a cross-sectional view taken along line II-II' of FIG. 2A.

Referring to FIGS. 2A and 2B, the film package 100A of an example embodiment may have the same or similar characteristics as those described with reference to FIGS. 1A to 1C, except that the second conductive film 152 extends more adjacently to the first side 110S1 of the film substrate 110 than the first conductive film 151. In the present example embodiment, the second conductive film 152 may extend to a region overlapping a third opening 140OP3 in a vertical direction (Z-axis direction). For example, the second distance between a second edge 152S of the second conductive film 152 and the first side 110S1 of the film substrate 110 may be smaller than the first distance between a first edge 151S of the first conductive film 151 and the first side 110S1 of the film substrate 110.

As described above, the second conductive film 152 extends towards (e.g., as closely as possible to) the first side 110S1 of the film substrate 110, so that heat flow toward the first side 110S1 of the film substrate 110 along the second conductive film 152 may be further increased.

Figure 3:
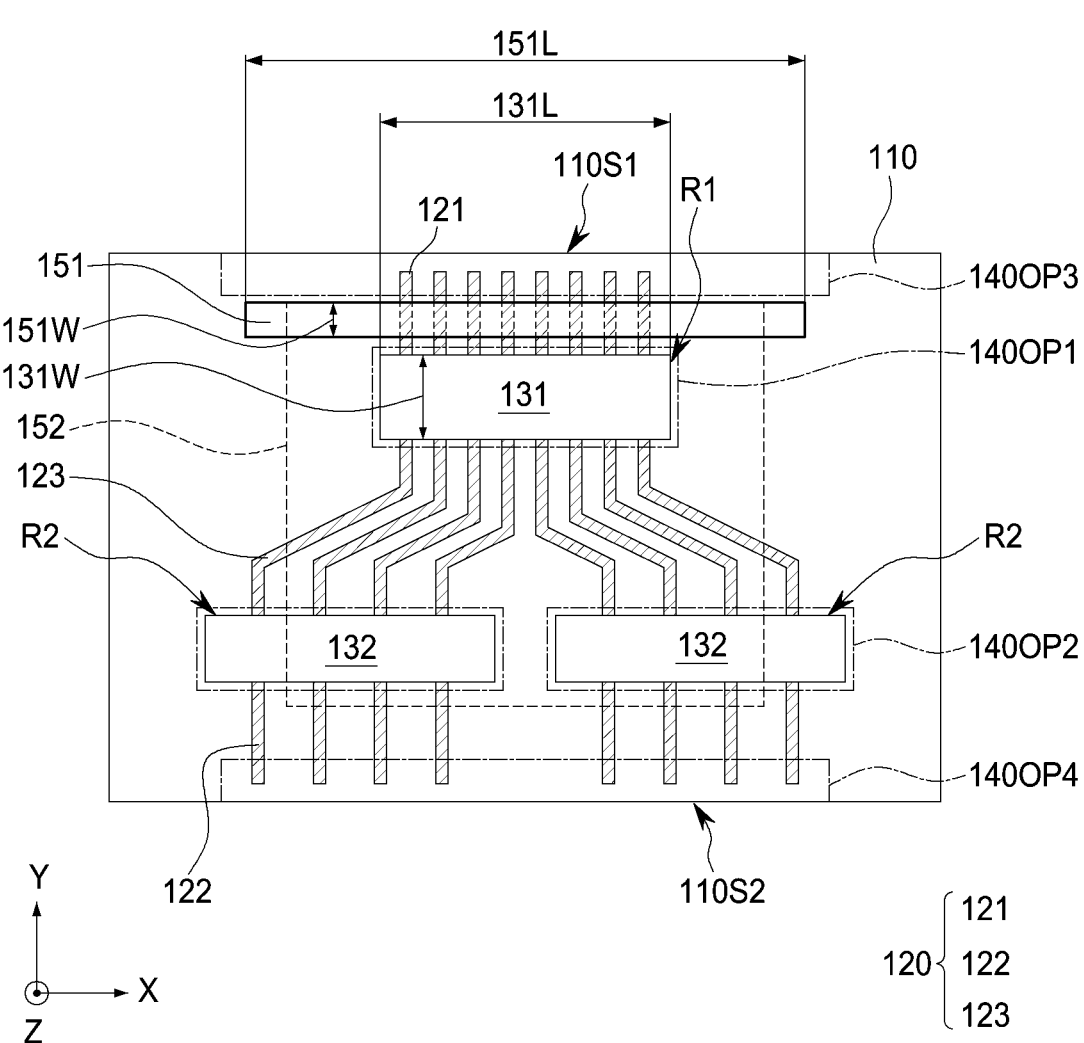
FIG. 3 is a plan view illustrating a film package according to an example embodiment of the present inventive concepts.

FIG. 3 is a plan view illustrating a film package 100B according to an example embodiment of the present inventive concept.

Referring to FIG. 3, the film package 100B according to an example embodiment may have the same or similar characteristics as those described with reference to FIGS. 1A to 2B, except for including the first conductive film 151 having a width 151W equal to or narrower than a width 131W of the first semiconductor chip 131. In this embodiment, the first conductive film 151 may have a larger planar area than that of the first semiconductor chip 131 in order to secure a heat dissipation effect. For example, the first conductive film 151 may have a length 151L, greater than a length 131L of the first semiconductor chip 131 in a second direction (X-axis direction), and a width 151W, equal to or smaller than the width 131W of the first semiconductor chip 131.

As described above, the first conductive film 151 of the present example embodiment may have a length 151L, greater than the length 131L of the first semiconductor chip 131, in order to maximize heat dissipation characteristics within a limited area between the first side 110S1 of the film substrate 110 and the first semiconductor chip 131.

Figure 4:
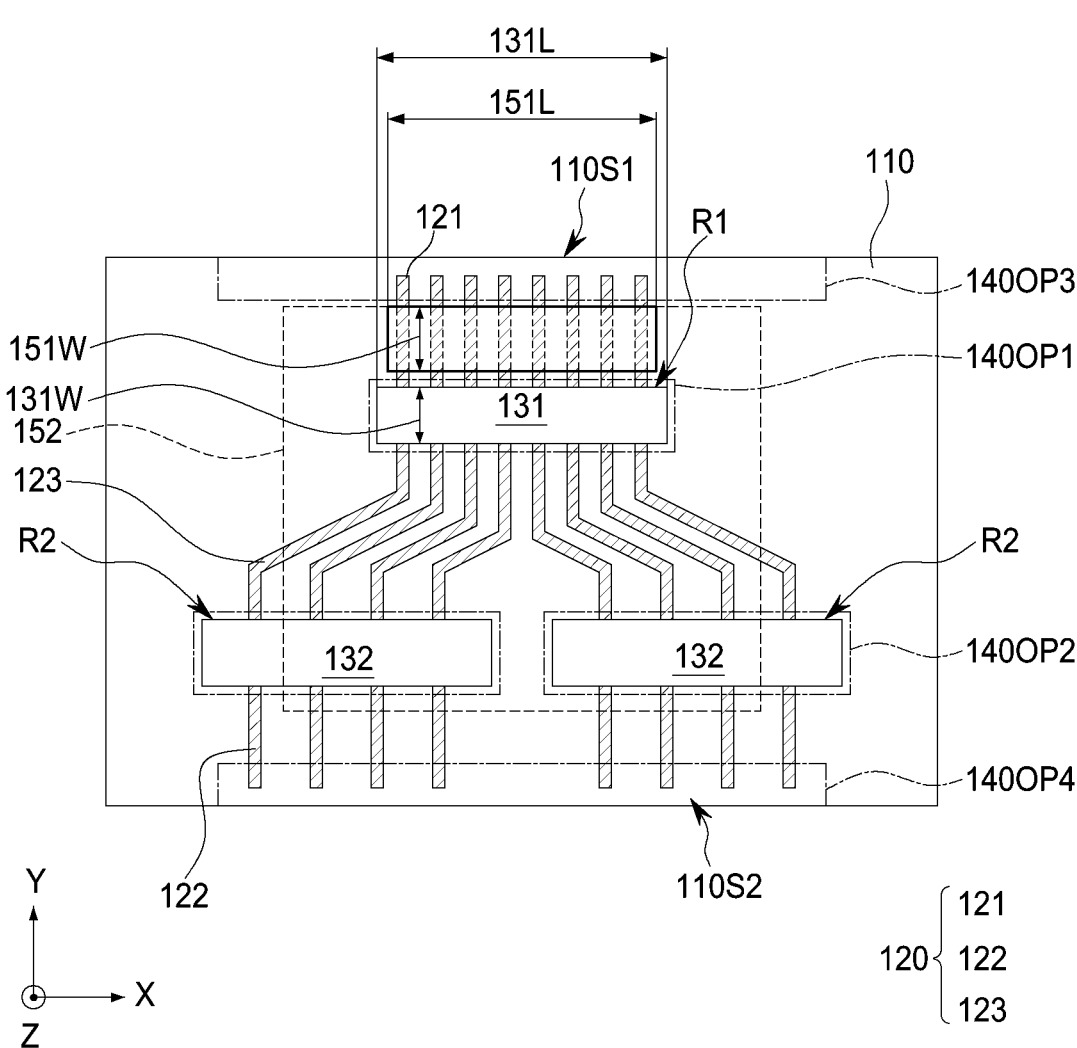
FIG. 4 is a plan view illustrating a film package according to an example embodiment of the present inventive concepts.

FIG. 4 is a plan view illustrating a film package 100C according to an example embodiment of the present inventive concept.

Referring to FIG. 4, the film package 100C according to an example embodiment may have the same or similar characteristics as those described with reference to FIGS. 1A and 2B, except for including a first conductive film 151 having a length 151L equal to or smaller than the length 131L of the first semiconductor chip 131. In this embodiment, the first conductive film 151 may have a larger planar area than that of the first semiconductor chip 131 in order to secure a heat dissipation effect. For example, the first conductive film 151 may have a length 151L, equal to or smaller than a length 131L of the first semiconductor chip 131 in the second direction (e.g., X-axis direction), and a width 151W, greater than the width 131W of the first semiconductor chip 131 in a first direction (e.g., Y-axis direction).

As described above, the first conductive film 151 of the present example embodiment may have a length 151L, greater than the length 131L of the first semiconductor chip 131, in order to maximize heat dissipation characteristics within a limited area between the first side 110S1 of the film substrate 110 and the first semiconductor chip 131.

Figure 5:
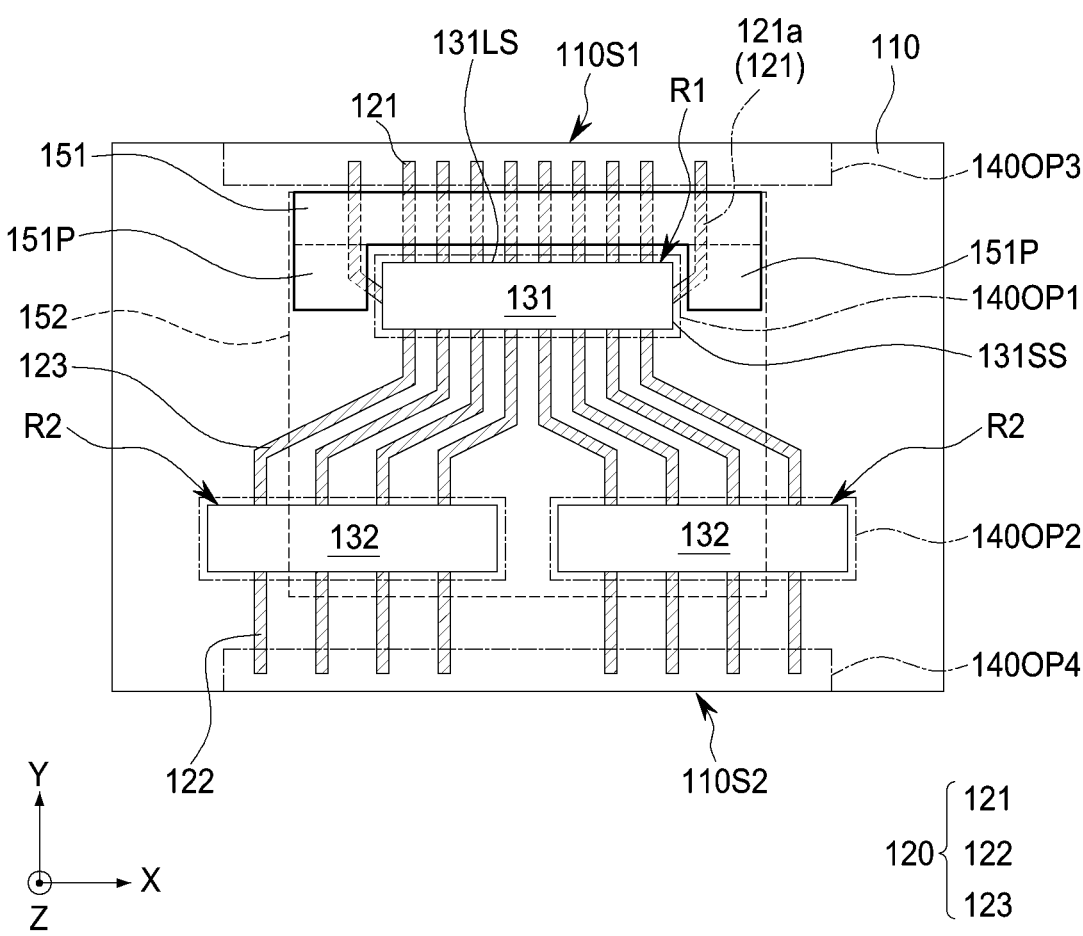
FIG. 5 is a plan view illustrating a film package according to an example embodiment of the present inventive concepts.

FIG. 5 is a plan view illustrating a film package 100D according to an example embodiment of the present inventive concept.

Referring to FIG. 5, the film package 100D according to an example embodiment may have the same or similar characteristics as those described with reference to FIGS. 1A and 4, except for including a first conductive film 151 including a protrusion 151P extending in the horizontal direction (e.g., Y-axis direction) of the first semiconductor chip 131. The first conductive film 151 of the present example embodiment may have a shape surrounding three surfaces of the first semiconductor chip 131 on a plane (e.g., the X-Y plane). For example, in a plan view, the first semiconductor chip 131 may have long sides 131LS extending in the first direction (e.g., the Y-axis direction) and short sides 131SS extending in the second direction (e.g., the X-axis direction), and at least a portion of input patterns 121a may extend from end surfaces 131SS of the first semiconductor chip 131 to a third opening 140OP3. In an example embodiment, a protrusion 151P extending along end surfaces 131SS of the first semiconductor chip 131 and overlapping at least a portion of input patterns 121a in a vertical direction (Z-axis direction) may be formed on one side of the first conductive film 151. As described above, by maximally securing an overlapping region of the input patterns 121 with the first conductive film 151, a heat flow toward the first side 110S1 of the film substrate 110 along the first conductive film 151 may be further increased.

Figure 6A:
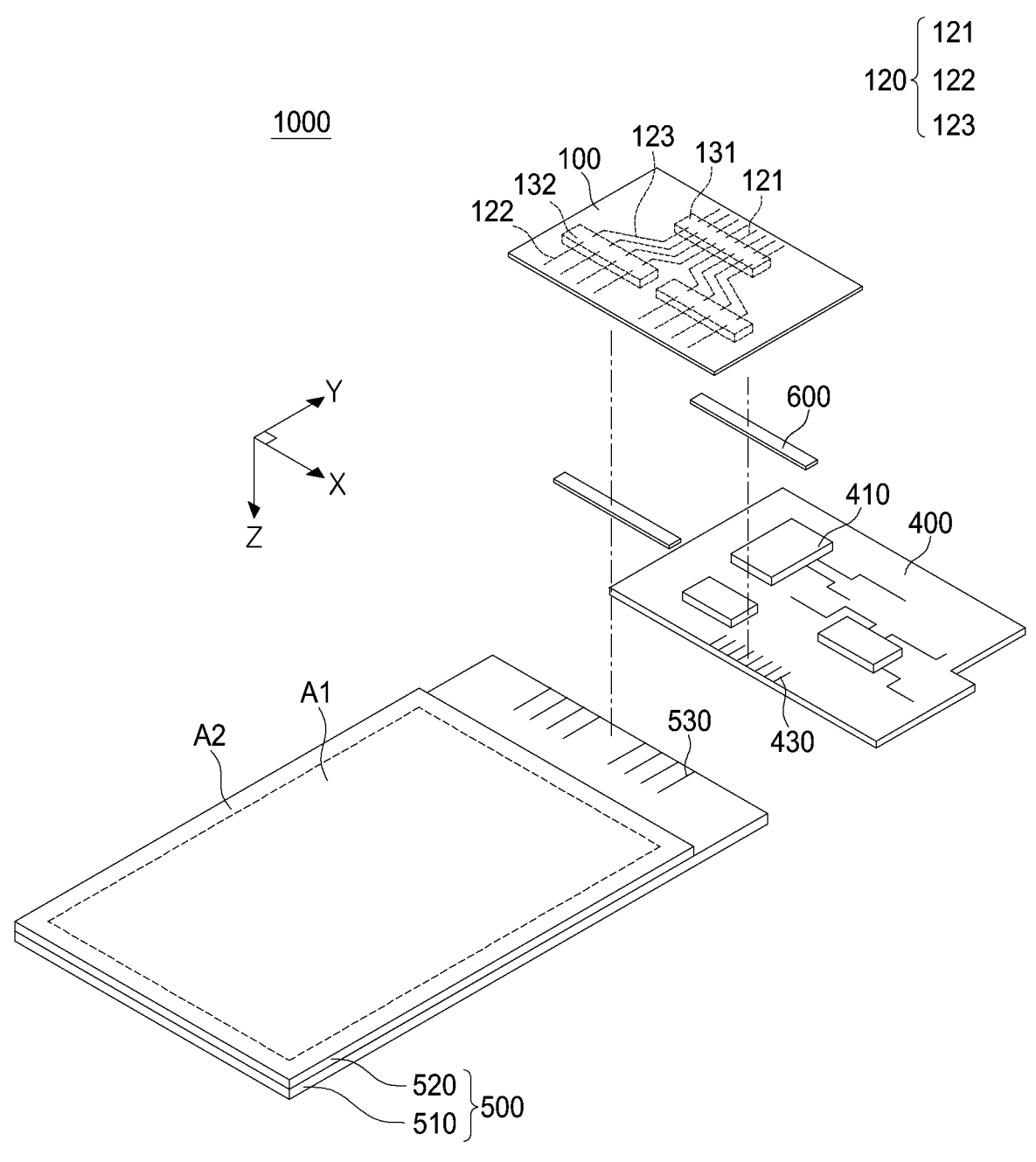
FIG. 6A is a perspective view illustrating a package module including a film package according to an example embodiment of the present inventive concepts.
Figure 6B:
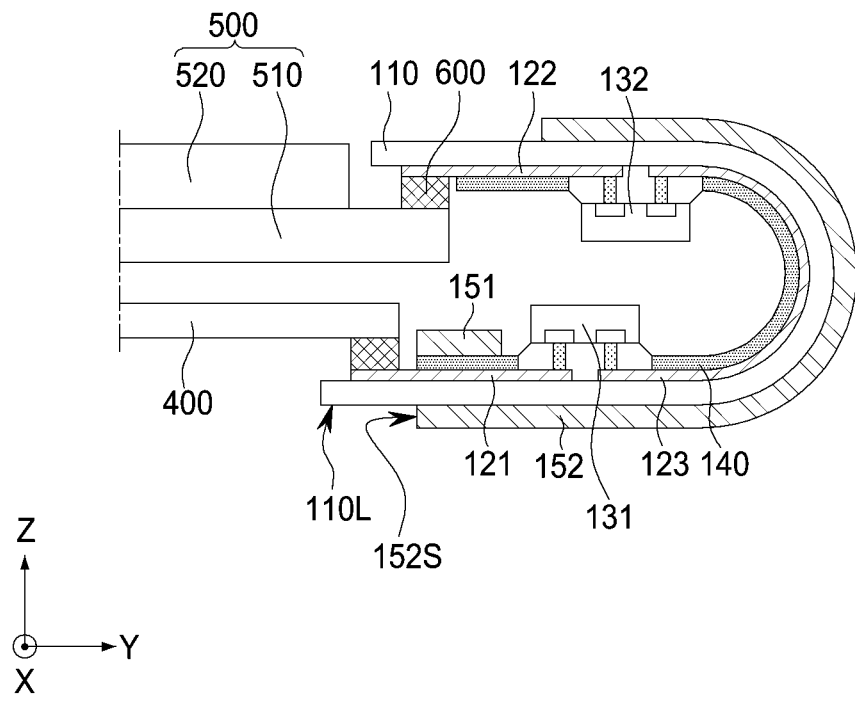
FIG. 6B is a cross-sectional view illustrating a usage state of the package module of FIG. 6A.

FIG. 6A is a perspective view illustrating the package module 1000 including the film package 100 according to an example embodiment of the present inventive concepts, and FIG. 6B is a cross-sectional view illustrating a usage state of the package module 1000 of FIG. 6A. FIG. 6B illustrates a state in which the film package 100 is bent in the package module 1000 of FIG. 6A.

Referring to FIGS. 6A and 6B, the package module 1000 may include at least one film package 100, a driving printed circuit board 400, and a display panel 500.

The film package 100 may include a display driver IC (DDI). For example, different types of semiconductor chips may be mounted on the film package 100. For example, a first semiconductor chip 131 may be a source driving chip, and a second semiconductor chip 132 may be a gate driving chip. The film package 100 may be connected to each of the driving printed circuit board 400 and the display panel 500. The wiring patterns 120 of the film package 100 may be electrically connected to each of a driving connection interconnection 430 of the driving printed circuit board 400 and the panel connection interconnection 530 of the display panel 500. The film package 100 may receive a signal output from the driving printed circuit board 400 and transmit the same to the display panel 500.

In an example embodiment, the package module 1000 may include one film package 100. For example, when the display panel 500 is to provide a screen having a small area, such as a mobile phone, or supports a relatively low resolution, the driving printed circuit board 400 and the display panel 500 may be interconnected through one film package 100. In this case, the film package 100 may be connected to one side of the display panel 500. Though the package module 1000 is illustrated as including the film package 100, the example embodiments are not limited thereto, and may include any one of the film packages 100, 100A, 100B, 100C, and/or 100D described above.

According to an example embodiment, the package module 1000 may include a plurality of film packages 100. For example, when the display panel 500 is to provide a screen of a large area, such as a television, or supports a relatively high resolution, the driving printed circuit board 400 and the display panel 500 may be interconnected through a plurality of film packages 100. In this case, one or a plurality of the plurality of film packages 100 may be connected to each of two or more side sides of the display panel 500.

In the film package 100, an input pattern (or a pad) 121 may be exposed at one end, and an output pattern (or a pad) 122 may be formed at the other end. Each of the input pattern 121 and the output pattern 122 may be connected to each of a driving connection interconnection 430 of the driving printed circuit board 400 and a panel connection interconnection 530 of the display panel 500 by an anisotropic conductive layer 600. The anisotropic conductive layer 600 may be an anisotropic conductive film in which conductive particles are dispersed in an insulating adhesive layer or an anisotropic conductive paste. The anisotropic conductive layer 600 is interposed between opposing electrodes, so that the anisotropic conductive layer 600 may have anisotropic electrical properties in which electricity is conducted only in the third direction (Z-axis direction) of electrodes facing each other, and the anisotropic conductive layer 600 and is insulated in a direction between the adjacent electrodes (e.g., in the second and/or X-axis direction).

One or more driving circuit chips 410 capable of simultaneously or sequentially applying power and a signal to the film package 100 may be mounted on the driving printed circuit board 400.

The display panel 500 may be, for example, a liquid crystal display (LCD) panel, a light emitting diode (LED) panel, an organic LED (OLED) panel, a plasma display panel (PDP), and/or the like.

The display panel 500 may include a transparent substrate 510, an image region 520 formed on the transparent substrate 510, and a panel connection interconnection 530. The transparent substrate 510 may be, for example, a glass substrate and/or a transparent flexible substrate. The image region 520 may include a display region A1 for displaying an image and a peripheral region A2 for applying a driving signal to the display region A1. A plurality of pixels in the display region A1 may be connected to a plurality of panel connection interconnections 530 corresponding to each other, and may be operated according to a signal provided by the display driving chip DDI mounted on the film package 100.

Figure 7:
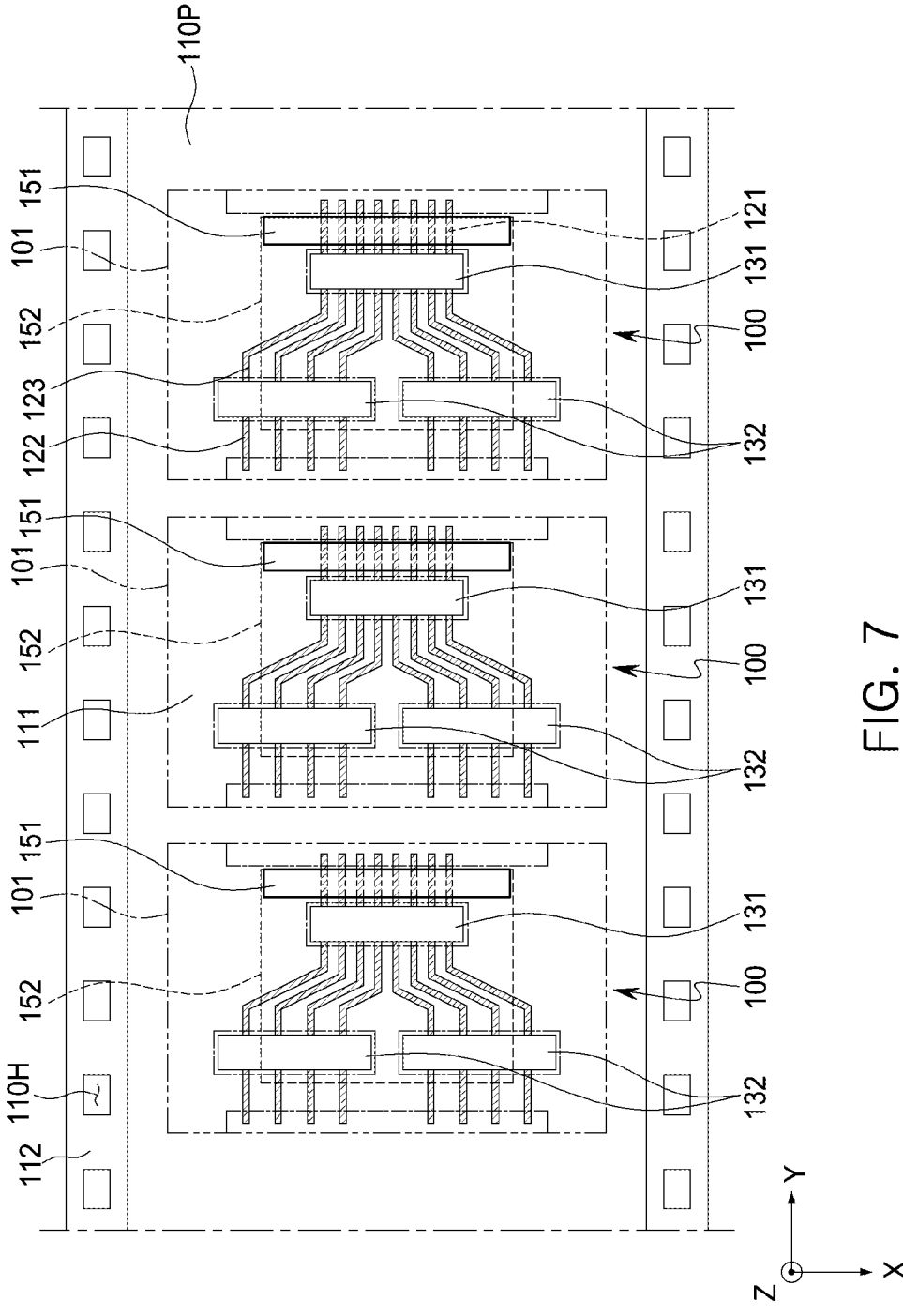
FIG. 7 is a layout of a base film including the film packages of FIG. 1A.

FIG. 7 is a layout of a base film 110P including the film packages 100 of FIG. 1A.

Referring to FIG. 7, the base film 110P is defined by a cutting line 101 and may include circuit regions 111 arranged in a first direction (Y-axis direction) and perforation (PF) regions 112 disposed at both ends of the base film 110P. Components in the circuit regions 111 may constitute the film package 100.

A protective layer (not illustrated) including first to fourth openings 140OP1, 140OP2, 140OP3, and 140OP4, a plurality of wiring patterns 120, first and second semiconductor chips 131 and 132, a first conductive film 151, and a second conductive film 152 may be disposed in the circuit regions 111. The plurality of wiring patterns 120 may extend in a first direction (Y-axis direction) and may extend to an edge of the cutting line 101. The first and second semiconductor chips 131 and 132 may be electrically connected to the plurality of wiring patterns 120 in a flip-chip manner. The first conductive film 151 may be disposed on a front surface of the base film 110P to overlap at least a portion of input patterns 121 positioned between the first semiconductor chip 131 and one side of the cutting line 101 on a plane. The second conductive film 152 may be disposed on a back surface of the base film 110P to overlap the first and second semiconductor chips 131 and 132 and the first conductive film 151 on a plane. Here, the cutting line 101 may be a virtual dividing line.

Sprocket holes 110H may be arranged along the first direction (the Y-axis direction) in the PF regions 112. The sprocket holes 110H may be through holes completely penetrating through the base film 110P. Reeling and releasing of the base film 110P may be controlled using the sprocket holes 110H.

As set forth above, according to some example embodiments of the present inventive concepts, a film package having improved heat dissipation characteristics may be provided by disposing first and second conductive films adjacently to a first semiconductor chip on which hot spots are formed.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above. For example, the device may be otherwise oriented (rotated 90 degrees or at other orientations) and the spatially relative descriptors used herein interpreted accordingly.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not refer to the same example embodiment, and is provided to emphasize a particular feature or characteristic different from that of another example embodiment. However, example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

It will be understood that elements and/or properties thereof described herein as being the "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

Terms used herein are used only in order to describe an example embodiment rather than limiting the present disclosure. In this case, singular forms include plural forms unless interpreted otherwise in context.

While example embodiments have been shown and described above, it will be apparent to those skilled in the art that modifications and variations could be made without departing from the scope of the present inventive concept as defined by the appended claims.

What is claimed is:

1. A film package, comprising:
a film substrate having first and second surfaces opposing each other and first and second sides opposing each other, the first surface having a first region and a second region spaced apart in a first direction parallel to the first surface;
a plurality of wiring patterns including an input pattern, an interconnection pattern, and an output pattern, the input pattern extending from the first region to the first side of the film substrate, the output pattern extending from the second region to the second side of the film substrate, and the interconnection pattern extending from the first region to the second region;
a first semiconductor chip on the first region and electrically connected to the input pattern and the interconnection pattern;
at least one second semiconductor chip on the second region and electrically connected to the interconnection pattern and the output pattern;
a protective layer on the first surface covering at least a portion of the plurality of wiring patterns, the protective layer including a first opening exposing at least a portion of the first region, a second opening exposing at least a portion of the second region, and a third opening exposing at least a portion of the input pattern adjacent to the first side;
a first conductive film on the protective layer between the first opening and the third opening and extending in a second direction, the second direction intersecting the first direction; and a second conductive film on the second surface and overlapping the first conductive film in a third direction, the third direction perpendicular to the first surface,
wherein the first semiconductor chip includes a source driving chip,
wherein the at least one second semiconductor chip includes a gate driving chip,
wherein, when viewed from the third direction, the first semiconductor chip has a first long side, a second long side, a first short side, and a second short side,
wherein the first long side and the second long side are opposite to each other in the first direction,
wherein the first short side and the second short side are opposite to each other in the second direction,
wherein the first long side faces the first side of the film substrate,
wherein the first conductive film is adjacent only to one or more of the first long side, the first short side, and the second short side among the first long side, the second long side, the first short side, and the second short side,
wherein, with respect to the first surface of the film substrate, an upper surface of the first conductive film is lower than an upper surface of the first semiconductor chip,
wherein the first conductive film is adjacent to the first long side and not adjacent to the second long side, and
wherein the first conductive film overlaps the input pattern in the third direction and exposes the protective layer in a section where the protective layer covers the interconnection pattern in the third direction.

2. The film package of claim 1, wherein the first conductive film has a bar shape extending in a longitudinal direction of the first semiconductor chip.

3. The film package of claim 2, wherein the first conductive film comprises a protrusion extending in the first direction such that the protrusion extends along an end surface of the first semiconductor chip.

4. The film package of claim 1, wherein the first conductive film has a width equal to or smaller than a width between the first opening and the third opening.

5. The film package of claim 4, wherein the width between the first opening and the third opening is smaller than a width between the first opening and the second opening.

6. The film package of claim 1, wherein the first conductive film has a planar area equal to or greater than that of the first semiconductor chip.

7. The film package of claim 6, wherein the first conductive film has a length greater than a length of the first semiconductor chip in the second direction, and a width equal to or smaller than a width of the first semiconductor chip in the first direction.

8. The film package of claim 6, wherein the first conductive film has a length equal to or smaller than a length of the first semiconductor chip in the second direction and a width greater than a width of the first semiconductor chip in the first direction.

9. The film package of claim 1, wherein
the first conductive film has a first edge adjacent to the first side, and the second conductive film has a second edge adjacent to the first side such that the first and second edges are on a same line in the third direction.

10. The film package of claim 1, wherein the first conductive film does not overlap with the protective layer between the first opening and the second opening.

11. The film package of claim 1, wherein the second conductive film has a planar area greater than that of the first conductive film.

12. The film package of claim 1, wherein the second conductive film overlaps the first semiconductor chip and the second semiconductor chip in the third direction.

13. The film package of claim 1, wherein the second conductive film is more closely adjacent to the first side of the film substrate than to the second side of the film substrate.

14. The film package of claim 13, wherein the protective layer further comprises a fourth opening exposing at least a portion of the output pattern adjacent to the second side.

\* \* \* \* \*